(12) United States Patent
Devins et al.

(10) Patent No.: US 6,571,373 B1
(45) Date of Patent: May 27, 2003

(54) SIMULATOR-INDEPENDENT SYSTEM-ON-CHIP VERIFICATION METHODOLOGY

(75) Inventors: Robert J. Devins, Essex Junction, VT (US); Mark E. Kautzman, Colchester, VT (US); Kenneth A. Mahler, Essex Junction, VT (US); William E. Mitchell, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/494,565

(22) Filed: Jan. 31, 2000

(51) Int. Cl.$^7$ ............................................. G06F 17/50
(52) U.S. Cl. .............................................. 716/5; 716/4
(58) Field of Search ..................... 716/4, 5; 703/13–17; 714/738, 739, 30, 33, 42

(56) References Cited

U.S. PATENT DOCUMENTS

| | | | |
|---|---|---|---|
| 5,600,579 A | 2/1997 | Steinmetz, Jr. .............. | 364/578 |
| 5,838,948 A | 11/1998 | Bunza ......................... | 395/500 |
| 6,052,524 A | * 4/2000 | Pauna .................... | 395/500.43 |
| 6,182,258 B1 | * 1/2001 | Hollander ..................... | 714/739 |
| 6,240,543 B1 | * 5/2001 | Bhandari ..................... | 716/18 |
| 6,249,893 B1 | * 6/2001 | Rajsuman et al. .......... | 714/741 |
| 6,269,467 B1 | * 7/2001 | Chang et al. .................. | 716/1 |

OTHER PUBLICATIONS

Shah et al, "Target Processor and Co–Verification Environment Independent Adapter—A Technoligy to Shorten Cycle–Time for Retargeting T1 Processor Simulators in HW/SW Co–Verification Environments," IEEE, Sep. 1999, pp. 37–41.*

Clement et al, "Fast Prototying: A System Design Flow Applied to a Complex System–on–Chip Multiprocessor Design," IEEE, Jun. 1999, pp. 420–424.*

Bill Cordan, "An Efficient Bus Architecture for System–on–Chip Design," IEEE, May 1999, pp. 623–626.*

Arnold S. Berger, "Applying Hardware/Software Co–Design to Systems–on–a–Chip," IEEE, Sep. 1998, pp. 22–28.*

Chauhan et al, "Verifying IP–Core Based System–on–Chip Designs," IEEE, Sep. 1999, pp. 27–31.*

Bulent Dervisoglu, "Design for Testability: It is Time to Deliver it for Time–to–Market," IEEE, Sep. 1999, pp. 1102–1111.0.*

* cited by examiner

Primary Examiner—Vuthe Siek
(74) Attorney, Agent, or Firm—Connolly Bove Lodge & Hutz, LLP; Richard M. Kotulak; Larry J. Hume

(57) ABSTRACT

A method for communicating with and controlling design logic modules ("cores") external to a system-on-chip (SOC) design during verification of the design uses verification software to generate and apply test cases to stimulate components of an SOC design in simulation; the results are observed and used to de-bug the design. Typically, SOC designs interface with cores that are external to the design. Existing methods of including such external cores in a verification test of a SOC design typically entail having to create special test cases to control the external cores; such test cases typically do not communicate with test cases being applied internally to the SOC and therefore lack realism. An external memory-mapped test device (EMMTD) according to the present invention is coupled between a SOC design being tested in simulation, and cores external to the SOC design. Internal EMMTD logic provides for control and status monitoring of an external core coupled to an EMMTD bi-directional bus by enabling functions including driving data on the bus, reading the current state of data on the bus, and capturing positive and negative edge transitions on the bus. In one embodiment, a test case being executed by a simulator embedded processor in the SOC can communicate with and control elements external to the SOC, by using the EMMTD to perform such functions as initiating external core logic which drives test signals to an internal core, directly controlling an internal core via its external interface, or determining the status of an external core.

38 Claims, 7 Drawing Sheets

SIMULATOR-INDEPENDENT SYSTEM-ON-CHIP VERIFICATION METHODOLOGY

CROSS REFERENCE TO RELATED APPLICATIONS

This application is related by common inventorship and subject matter to co-pending applications titled "Method of Controlling External Models in System-On-Chip Verification", Ser. No. 09/494,230; "Method of Developing Re-Usable Software for Efficient Verification of System-On-Chip Integrated Circuit Designs", Ser. No. 09/494,907; "Method for Efficient Verification of System-On-Chip Integrated Circuit Designs Including an Embedded Processor", Ser. No. 09/494,564; "Processor-Independent System-On-Chip Verification for Embedded Processor Systems" Ser. No. 09/494,386, and "Method for Re-Using System-On-Chip Verification Software in an Operating System" Ser. No. 09/494,236. The listed applications are assigned to International Business Machines Corporation and are entirely incorporated herein by this reference.

BACKGROUND OF THE INVENTION

The present invention relates to the testing of computer system designs by software simulation, and more particularly to a verification methodology which provides portability across simulator types.

The complexity and sophistication of present-day integrated circuit (IC) chips have advanced significantly over those of early chip designs. Where formerly a chip might embody relatively simple electronic logic blocks effected by interconnections between logic gates, currently chips can include combinations of complex, modularized IC designs often called "cores" which together constitute an entire "system-on-a-chip", or SOC.

In general, IC chip development includes a design phase and a verification phase for determining whether a design works as expected. The verification phase has moved increasingly toward a software simulation approach to avoid the costs of first implementing designs in hardware to verify them.

A key factor for developers and marketers of IC chips in being competitive in business is time-to-market of new products; the shorter the time-to-market, the better the prospects for sales. Time-to-market in turn depends to a significant extent on the duration of the verification phase for new products to be released.

As chip designs have become more complex, shortcomings in existing chip verification methodologies which extend time-to-market have become evident.

Typically, in verifying a design, a simulator is used. Here, "simulator" refers to specialized software whose functions include accepting software written in a hardware description language (HDL) such as Verilog or VHDL which models a circuit design (for example, a core as described above), and using the model to simulate the response of the design to stimuli which are applied by a test case to determine whether the design functions as expected. The results are observed and used to de-bug the design.

In order to achieve acceptably bug-free designs, verification software must be developed for applying a number of test cases sufficient to fully exercise the design in simulation. In the case of SOC designs, the functioning of both the individual cores as they are developed, and of the cores interconnected as a system must be verified. Moreover, a complete SOC design usually includes an embedded processor core; simulation which includes a processor core tends to require an inordinate amount of time and computing resources, largely because the processor is usually the most complex piece of circuitry on the chip and interacts with many other cores.

It can be appreciated from the foregoing that verification of an SOC can severely impact time-to-market, due to the necessity of developing and executing software for performing the numerous test cases required to fully exercise the design.

However, inefficiencies in current verification methodologies exacerbate time pressures. For example, unit-level (i.e., individual core as opposed to system-on-chip) verification is typically performed on an event simulator, which provides for ease in de-bugging a design but is comparatively slow, while the later SOC verification utilizes a cycle simulator for greater speed. Moreover, there are a variety of different commercially-available simulator types which are typically used in SOC design verification. When interpreting HDL to generate a software model of a design for simulation, each simulator type identifies constituent elements of a model, such as input or output signals or registers, according to a simulator-specific format. A test case which is applying stimulus to a particular model being simulated needs to communicate with the model in the format used by the particular simulator.

The need to adapt verification software for the transition from an event simulator to a cycle simulator and to communicate with a model being simulated in a simulator-specific format typically entails a coding effort which slows verification. Accordingly, it would be generally desirable in verification be able to design test cases and other verification software without being concerned for simulator-specific details, since this would enable faster, more efficient verification, portability across verification platforms, and, consequently, reduced time-to-market.

SUMMARY OF THE INVENTION

The present invention provides a method for performing simulator-independent verification of component cores of a SOC design. A simulator-independent environment is implemented in computer-executable instructions which allows for verification software to be easily portable across simulator types and verification stages. The simulator-independent environment interfaces between a test case generator and a specific simulator type being used to simulate a model (core), receives a request from the test case generator representing a stimulus to a design element in the model, and converts the stimulus into a simulator-specific form which may be applied to the model.

In an embodiment, the simulator-independent environment utilizes hierarchical data structures to organize simulator-specific information. Depending upon what kind of simulator is being used for a simulation session, corresponding functions in the simulator-independent environment are invoked to obtain simulator-specific information from files built during initialization, and used to access a design element in the simulated model in response to a request from a test case generator.

The simulator-independent environment further includes simulator-independent clock models corresponding to varying simulation clock frequencies. For a particular simulation session, a given clock model may be linked to a plurality of bus functional models to drive the bus functional models at the appropriate user-defined clock frequency. This allows a generalized bus functional model to be configured to run at any clock speed, simply by being associated with the appropriate clock model object.

DETAILED DESCRIPTION OF THE INVENTION

A preferred embodiment of the invention comprises computer-executable instructions which implement a simulator-independent environment for use in design verification. The simulator-independent environment provides a platform for running a test case on any simulator which is supported.

Figure 1:
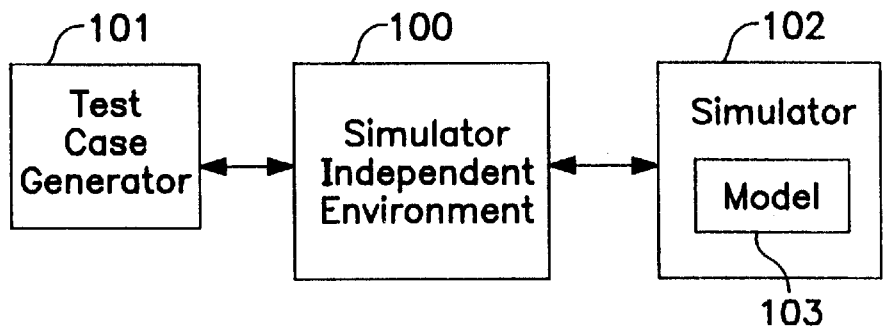
FIG. 1 shows a high-level functional block diagram of a simulator-independent environment (SIE) according to the present invention.

FIG. 1 shows a high-level functional block diagram of an embodiment. The model 103 represents a HDL description of a logic design. An HDL description can describe the function of a design at varying levels of abstraction, prior to its actual physical implementation in silicon. The model 103 is input to simulator 102. Simulator 102 interprets the HDL descriptions in the model 103 to simulate the behavior of a hardware device corresponding thereto, in response to a test stimulus which is input from a test case generator 101 via the simulator-independent environment (SIE) 100.

The stimulus generated by test case generator (TCG) 101 typically takes the form of a generic, high-level request for access to the model which is applied by a bus functional model (BFM) in a specific bus protocol, to verify that the model can communicate in that bus protocol. A verification test comprising the application of a sequence of such stimuli typically produces, as output, results data representing the response of the simulated design which is compared to expected results, to determine whether the design functions as expected. The design may subsequently be revised to improve performance or de-bug errors.

Figure 2:
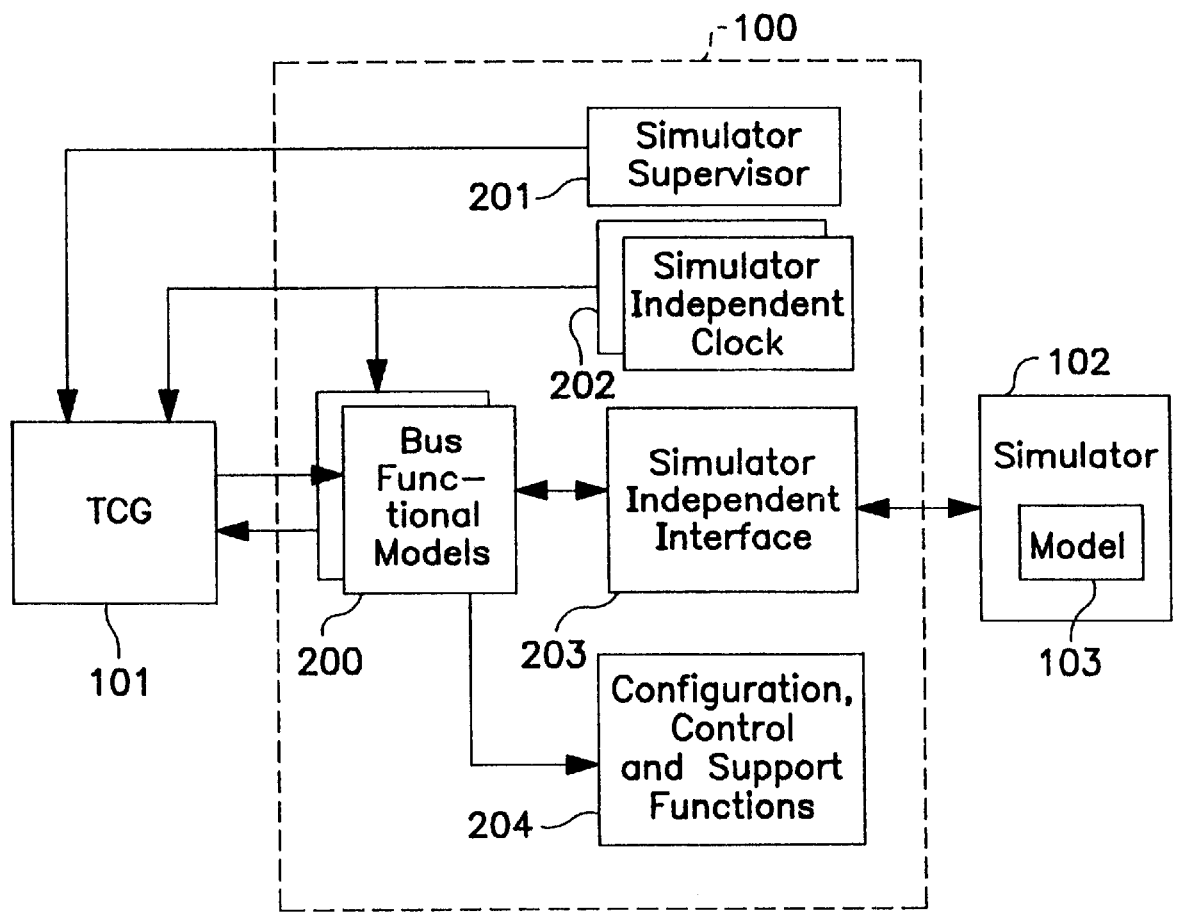
FIG. 2 shows a more detailed representation of the SIE.

The SIE 100 comprises computer-executable instructions for enabling the BFM to apply a stimulus to the model 103 on behalf of the TCG 101 without having to provide any simulator-specific information. A more detailed representation of the SIE 100 is shown in FIG. 2. The SIE 100 comprises a simulator supervisor 201 which configures the SIE 100 by initializing other components of the SIE 100, using configuration, control and support functions 204.

The SIE 100 further comprises simulator-independent clocks 202 which enable BFMs 200 to run at any clock speed used by the simulator 102, as described in greater detail hereinafter.

The BFMs 200 use the simulator-independent interface (SII) 203 to perform requests to the simulator 102 on behalf of the TCG 101 and to feed back information to the TCG 101, thereby isolating the TCG 101 from the specific simulator used in the verification and allowing a developer of BFMs to concentrate on a specific bus protocol used by the BFM without being concerned about specific simulator details.

BFMs are used at both the unit level of testing and in tests of SOC designs comprising core combinations to generate specific processor bus cycles to emulate the behavior of a processor which will eventually interface with the designs under test. There are a plurality of BFM types, each corresponding to either a master or slave of a hardware bus which may be internal or external to the design. A P-Bus (Processor-Bus) Master BFM, a DCR (Device Control Register) Master BFM (for SOC designs having a DCR bus, such as those using Power PC® architected processors), and a PLB (Processor Local Bus) Slave BFM are three examples.

In a typical verification methodology, BFMs are not portable across different simulator types, since the BFMs are usually written in a simulator-specific HDL (e.g., Verilog or VHDL) at a behavioral RTL (Register Transfer Language) level of abstraction. (Generally, an RTL style of behavioral description describes an input/output relationship for a design in terms of dataflow operations on signal and register values.) In contrast, the BFMs 200 according to the present invention may be designed without consideration for simulator-specific detail, as described hereinafter.

In a preferred embodiment, the computer-executable instructions which implement the SIE 100 are written in a high-level object-oriented language such as C++. However, the programming structures and functionality disclosed herein for practicing the invention may find specific implementations in a variety of forms using other programming languages, which implementations are considered to be within the abilities of a programmer of ordinary skill in the art after having reviewed the specification.

Object-oriented programming techniques involve the creation and use of independent software entities known as "objects". Each object typically comprises a grouping of data generally referred to as "attributes" and software routines for manipulating the data known as "member functions". A "class" refers generally to a grouping of related objects. A class serves as a general template from which particular objects are said to be "instantiated" by a "constructor" for a particular application.

Typically, a programmer conceives classes and objects so as to provide an interface to users which "abstracts" details of functionality. That is, software which invokes a class or object need only be aware of a general property or functionality of that class or object to utilize it, while the details of implementation are transparent to the invoking software.

Figure 3:
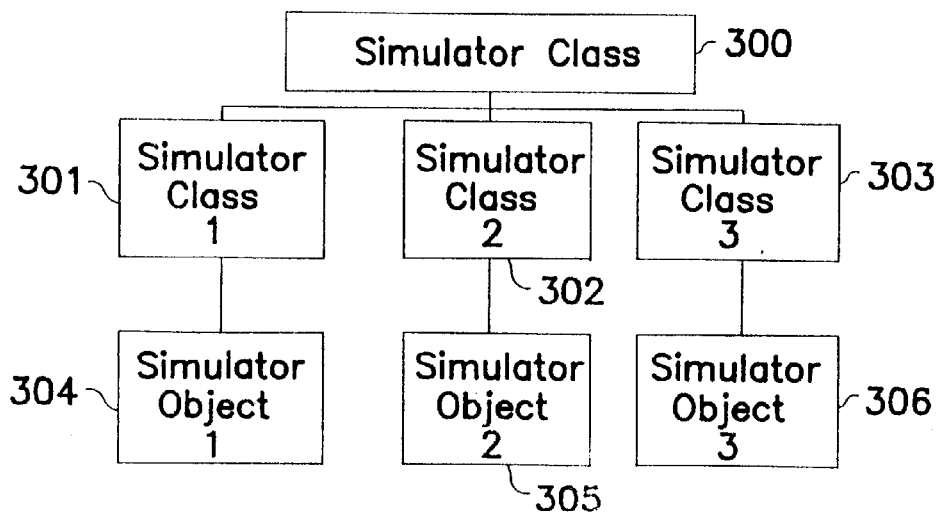
FIG. 3 shows a simulator class hierarchy implemented and used by the invention.

As shown in FIG. 3, classes and objects may be conceived of in terms of hierarchical relationships. FIG. 3 represents a simulator class hierarchy of the SII 203 including a base or parent simulator class 300. Derived or child classes 301–303 (i.e., classes lower in the hierarchy), for example, may correspond to distinct simulator types, such as event, cycle or instruction set simulators. Each derived class may include member objects representing distinct simulators; thus, simulator objects 1, 2, 3 (ref. no.s 304–306) represent three distinct simulators.

The simulator classes and member objects exemplified above are arbitrary and not limited to three. Examples of distinct commercially-available simulators include the Model Technology, Inc. (MTI) Verilog Programming Language Interface (PLI) simulator, the MTI Foreign Language Interface (FLI) simulator, and the IBM Cycle simulator.

Under a concept in object-oriented methodology known as inheritance, a derived class or object includes the attributes of its base class or classes. Thus, for example, simulator classes 301–303 are said to "inherit" simulator class 300. An inherited class is a member object of its derived class. Thus, simulator class 300 is a member object of each of simulator classes 301–303.

Figure 4:
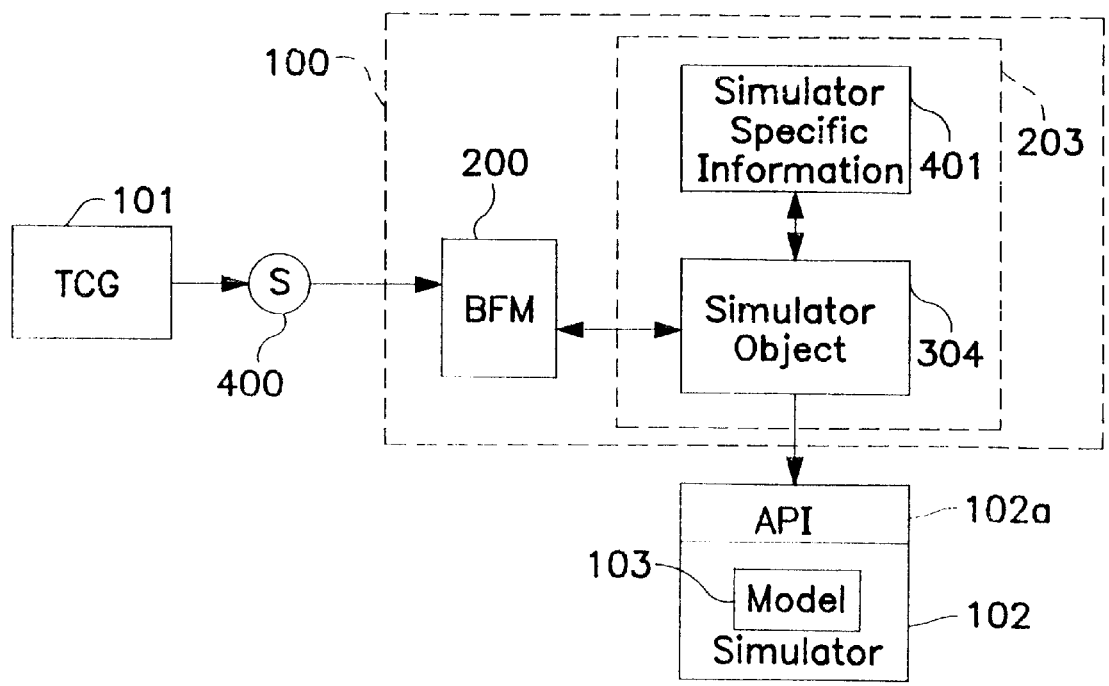
FIG. 4 shows an example of a test case generator using the SIE to apply a stimulus to a simulated model in a simulator-specific format.

The simulator class 300 is one aspect of the SIE 100 which abstracts the simulator-specific detail from a BFM. A BFM can call generic member functions in the simulator class 300 to access a model 103 for purposes of applying a stimulus on behalf of the TCG 101, while the simulator-specific details of implementation are carried out by a simulator object such as 304–306. A high-level flow diagram of a stimulus generated by a TCG 101 and applied by a BFM which uses a specific simulator object to access a model 103 during a simulation session is illustrated in FIG. 4. The TCG 101 generates a stimulus 400 ("S") by issuing a request (in the form of a function call, for example, in a C ++ implementation, to perform a DCR access, memory-mapped I/O, or a memory access) to the BFMs 200. The particular BFM 200 which is responsible for driving signals to the particular model 103 for which the stimulus 400 is intended invokes an access function in the simulator object 304 corresponding to the specific simulator being used (in this case, for example, simulator object 1 corresponding to simulator class 1). The simulator object 304 obtains simulator-specific information 401 for the BFM needed to service the request from the TCG, from objects built in the SII 203 during an initialization process for the simulation session. The simulator-specific information 401 is correlated with high-level symbols used by the SIE 100 to refer to design elements being simulated.

Most commercially-available simulators include an Application Program Interface (API), for enabling communication between the simulator 102 and a high-level programming language such as C ++. Examples include the Programming Language Interface (PLI) for Verilog simulators, and the Foreign Language Interface (FLI) for VHDL simulators. Such an API is represented in FIG. 4 by API 102a.

The simulator object 304 passes the simulator-specific information corresponding to the stimulus 400 to the API 102a, which uses the information to access the corresponding element in the model 103 to apply the stimulus. Typically, the model will change its state in response, and the TCG or BFM may request the new state from the simulator.

Figure 5:
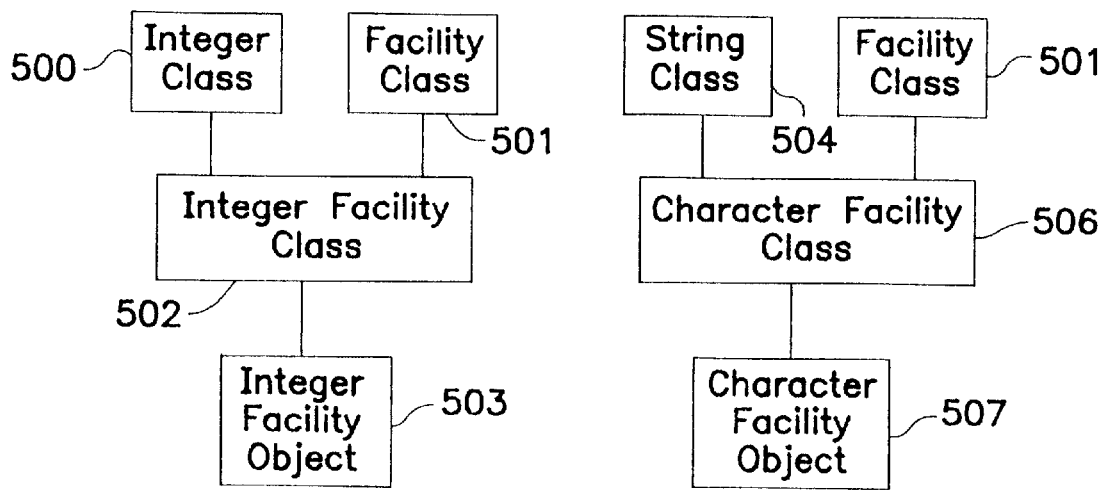
FIG. 5 shows a model facility class hierarchy implemented and used by the invention.

In an embodiment, additional hierarchical structures in the SIE 100 implement the simulator-specific information 401. As shown in FIG. 5, these include a model facility class hierarchy. "Model" refers to a design under test such as model 103. "Facility" refers to a design element within the model as it is defined within a particular simulator 102 for purposes of simulating a corresponding hardware element. Thus, "facility" may refer, for example, to a logic input or output signal of the model, a register, or a HDL "entity", i.e., a portion of HDL code identifying and defining a design at some level or levels of abstraction.

A facility may exist at some hierarchical level within the model. As noted above, HDL code describing a logic design typically comprises entities. Entities may be arranged hierarchically, with a top-level entity being logically connected to a set of lower-level entities, each of those lower-level entities being logically connected to still lower-level entities, and so on down to a gate level of description.

A facility has various attributes which are simulator-specific, including the facility's data type (e.g., register, net, enumeration, etc.), the kind of facility (e.g., signal or variable), and how it is to be written (e.g., as a temporary or stuck value).

Model facility classes of the SIE 100, as exemplified in FIG. 5, are used to abstract the simulator-specific information associated with corresponding facilities in a simulator model, such as model 103. The model facility classes include integer facility class 502 and character facility class 506. The integer facility class inherits the integer class 500 and the facility class 501, and the character facility class inherits the character class 504 and the facility class 501.

Integer facility objects such as 503 correspond to facilities in a model on which a test case needs to perform arithmetic operations without being concerned with non-binary values. Character facility objects such as 507 represent model facilities which take on binary and non-binary values.

Other facility objects (not shown) supported by the SIE 100 include long integer facility objects, floating point facility objects, and string facility objects. Long integer facility objects correspond to model facilities used in arithmetic and logical operations greater than 32 bits. Floating point facility objects correspond to floating point model facilities, and string facility objects correspond to string model facilities.

The above-described classes are passed to a simulator object when obtaining simulator-specific information for a BFM as described above, and the simulator object converts them to a specific simulator's API. For example, in the case of accessing an integer facility in the model, the instantiated simulator object will use the facility class portion and a value from the integer class inherited by the integer facility class 502 to perform the necessary conversion.

"Alias" files in the SIE 100 associate high-level programming language symbols used by the SIE, e.g., simple character strings, with corresponding model facilities. In particular, hierarchical facilities in a model may be associated with a character string in the high-level programming language. This allows re-compilation of the SIE code to be avoided in case of hierarchical name changes in the model. The alias file also can be used to specify how the facility is represented in the corresponding high-level code, for example, as an integer facility.

The alias files are used to initialize the facility objects described above with the simulator-specific information, including a facility's "handle" or identifier, its length in bits, and other simulator-specific information as noted above during an initialization process for a simulation session on a specific simulator. The facility objects are used by a simulator object to respond to a stimulus as described in connection with FIG. 4.

Figure 6:
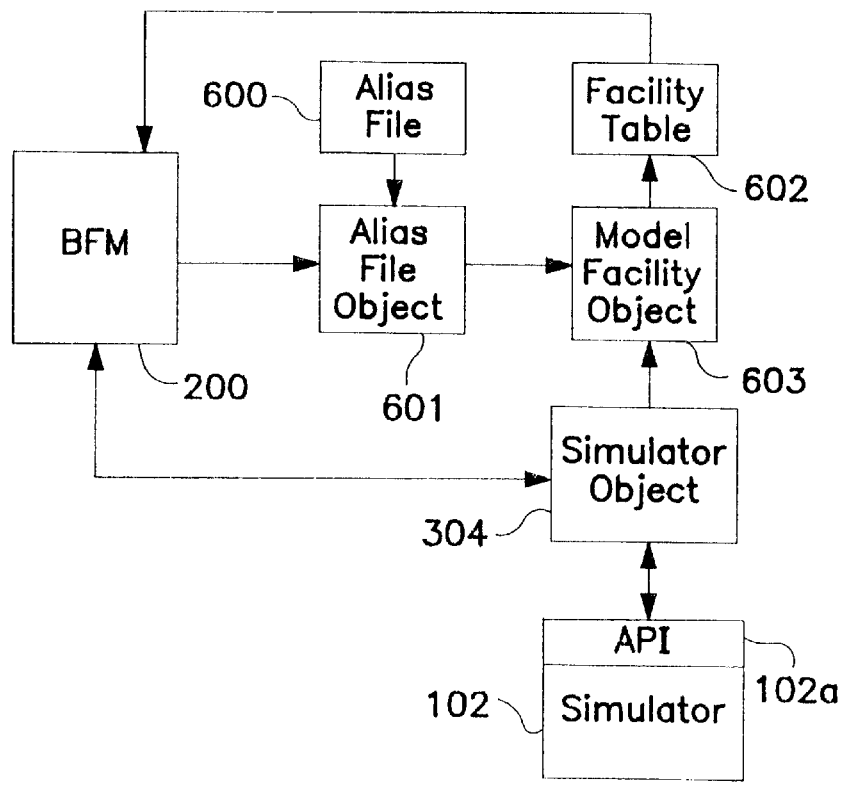
FIG. 6 shows an initialization process implemented by the invention to build simulator-specific information files for a simulation session.

FIG. 6 illustrates the initialization process. The process includes constructing a BFM 200 for applying a bus protocol to a facility or facilities in a model 103. During construction of the BFM, an alias file object 601 is invoked which reads the alias file 600 and creates a corresponding model facility object 603, which is passed to a simulator object 304. A specialization portion of the simulator object invokes functions in the simulator API 102a to initialize the model facility object 603 with simulator-specific information. This model facility object is then added to a facility table 602. After the facility table is built, the BFM 200 is initialized with references to the model facility objects which enable the BFM to use the references throughout a simulation session without having to look up model facility objects in the facility table.

Figure 7:
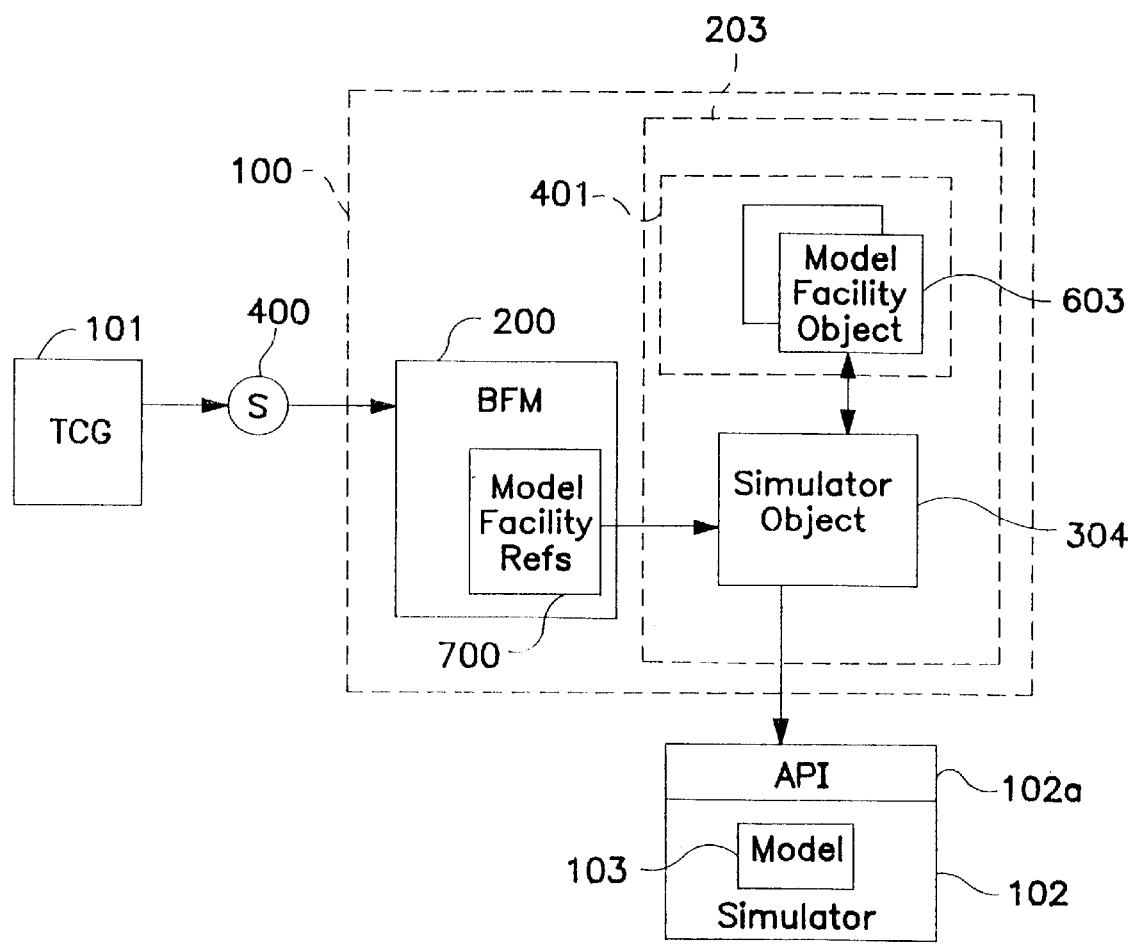
FIG. 7 shows a more detailed example of a test case generator using the SIE to apply a stimulus to a simulated model in a simulator-specific format.

In view of the above description, an implementation of the application of a stimulus discussed earlier in connection with FIG. 4 may be described more particularly as follows, referring to FIG. 7:

The simulator class 300 includes generic member functions for accessing facilities in the model 103 being simulated by simulator 102, termed herein for purposes of illustration "Write Facility" and "Read Facility", for example. These member functions can be passed different types of facility objects as described above, e.g., integer facility objects, character facility objects, long integer facility objects, etc.

The simulator supervisor 201 obtains the specific simulator type being used in a simulation session during initialization, and instantiates the corresponding simulator object from corresponding simulator class, which defines how "Write Facility" and "Read Facility" are implemented for that specific simulator. The simulator supervisor passes the BFMs 200 only the generic simulator class 300; due to the abstraction provided by the simulator class and object, the BFM need only call "Write Facility" or "Read Facility" without needing to provide any details of implementation.

The TCG 101 issues a stimulus 400 in the form of a request to BFM 200 to access a facility in the model 103, for example, to read from or write to the facility. The particular BFM which is configured to drive the facility being accessed services the request by passing a model facility object 603 corresponding to the request to the simulator object 304 corresponding to the specific simulator being used for the simulation session (in this example, simulator object 1). The BFM uses the references 700 obtained from the facility table 602 built during the initialization process to obtain the model facility object corresponding to the request.

As described above, the model facility object 603 contains information including the handle, length and simulator-specific information relating to the facility being accessed. The simulator object uses the information in the model facility object to invoke the appropriate access function in the specific simulator's API 102a. The API accesses the facility in the model 103 to service the request.

During a simulation session, multiple models or different portions of a model are typically required to be simulated at different clock speeds. The simulator-independent clocks 202 (FIG. 2) represent software structures which simplify BFM development and execution by abstracting clocking details using a base clock-triggered model (CTM) class to include all BFMs.

Figure 8:
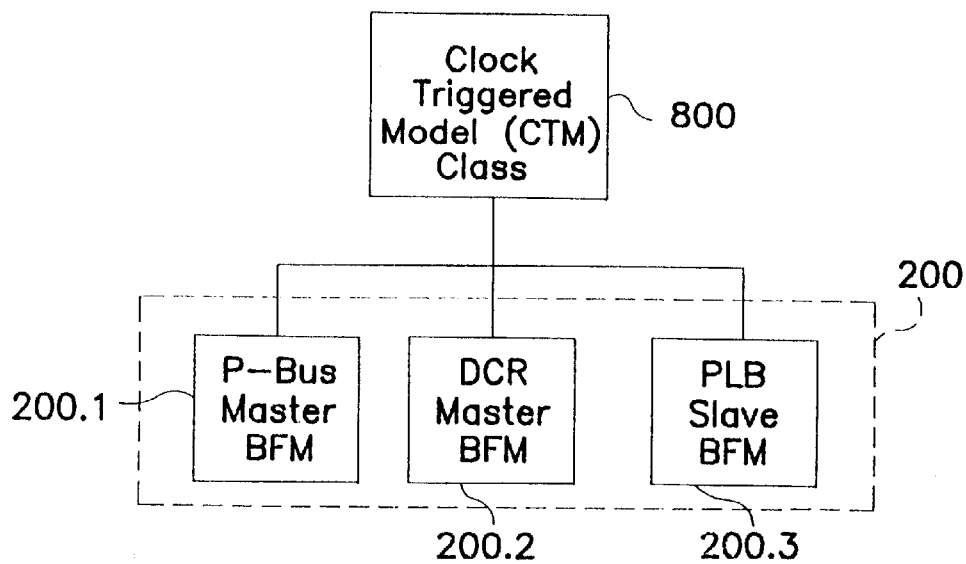
FIG. 8 shows a clock-triggered model class hierarchy implemented and used by the invention.

As illustrated in FIG. 8, BFMs 200 are all members or specializations of the CTM class 800. Member BFMs, the P-Bus Master BFM 200. 1, DCR Master BFM 200.2, and PLB Slave BFM 200.3 mentioned above are shown as examples, although the member BFMs of the CTM class are not limited to these.

"Clock-triggered" refers to bus protocol, i.e., whether bus operations are performed on a rising edge or a falling edge of the clock. The CTM class includes functions relating to both of these protocols, which are referred to herein as "Run Rising Edge" and/or "Run Falling Edge" functions, respectively. Each member BFM object includes its own version of one or both of these functions. The CTM further includes a parameter table (not shown) and code to initialize the parameter table via a configuration file class (not shown). The parameter table is used to uniquely configure the BFMs.

Using a base CTM class which includes the clock-triggered functions described above allows the use of "polymorphism" by a clock model object, as described hereinafter, to invoke a linked BFM without having to know what kind of BFM it is. Polymorphism refers to a concept in object-oriented programming in which a generic interface may be provided to a group of related functions. Additionally, because as a member object of the CTM class the BFM inherits the attributes of the CTM class, a BFM developer can utilize the all of the features of the CTM class, and yet not be concerned with any of its details. The foregoing simplifies BFM development by providing for clocking details to be abstracted from a developer of a BFM.

When the SIE 100 is initialized for a simulation session as discussed in connection with FIG. 6 above, the simulator supervisor 201 instantiates clock model objects, and then instantiates BFM objects, passing each BFM object a parameter which creates a pointer, via the CTM class, that links the BFM with a clock model object representing a clock speed at which the BFM is to execute. Linking via the generic CTM class interface allows the use of polymorphism by the clock model objects as described above. The clock model objects correspond with a range of user-specified clock frequencies at which a model or models are to be driven during a simulation session. Multiple BFMs of the same type may be linked to different clock model objects. The linking permits a clock model object to invoke a linked BFM using functions in the clock model object that correspond to a clock edge function in the BFMs. To invoke its attached BFMs, a clock model object may use a table containing pointers to all BFM objects that are linked to that particular clock model object.

Figure 9:
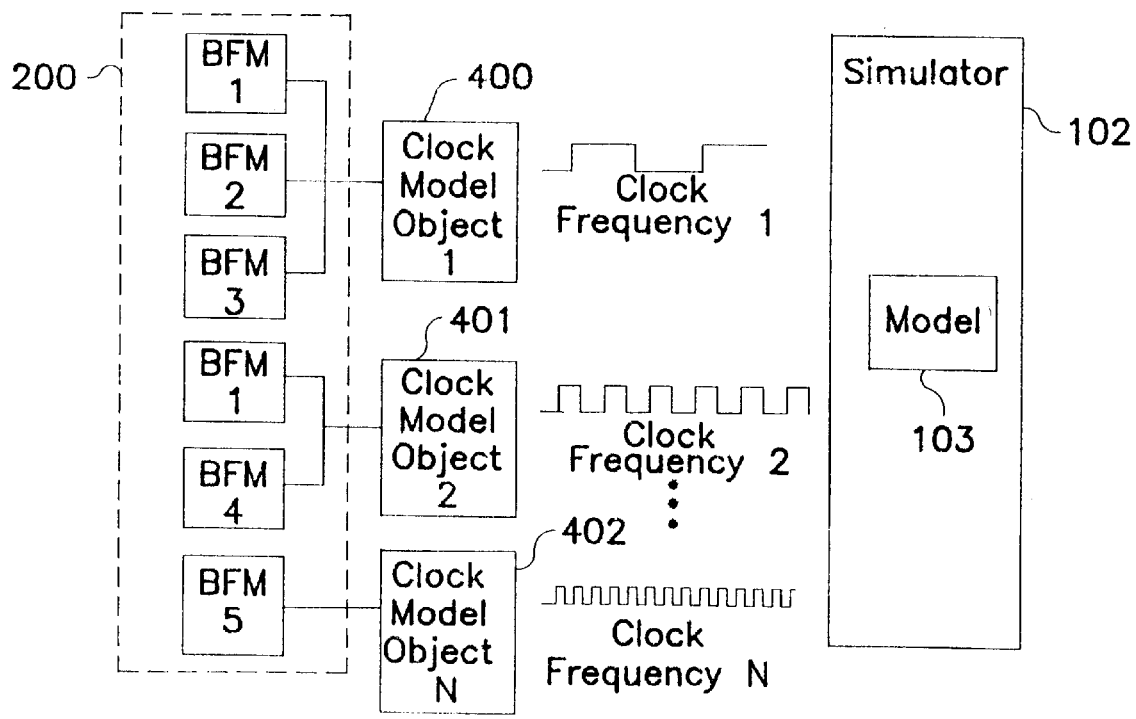
FIG. 9 shows clock model objects implemented by the invention, corresponding to distinct simulator clock frequencies, linked to a plurality of bus functional models (BFMs) implemented by the invention.

The foregoing is illustrated conceptually in FIG. 9. Simulator 102 generates distinct clock frequencies 1 through N for purposes of simulating the behavior of design components of a model 103 running at these distinct clock speeds. Clock model objects 1–N correspond to the distinct clock frequencies 1–N. The clock model objects are each linked to one or more BFMs 200. Multiple BFMs of the same type (e.g. BFM type 1) may be linked to different clock model objects.

A BFM may include a set of functions each representing a state of the bus being modeled. During a simulation cycle performed by the simulator in which the BFM is executed, a bus state function monitors the state of the bus and decides whether to perform some work required of it or to change its state. A change of state may be implemented by a function jump table using a bus state variable as its index, to effect a jump to a function representing a different bus state.

In the overall flow of execution of simulation cycles using the simulator-independent clock structures as described above, once the SIE 100 has been initialized, control begins in the simulator 102. The simulator begins to execute simulation cycles to simulate the response of a model being stimulated by a test case generator. The simulator generates different clock speeds to drive different portions of the model. When the simulator generates a clock edge in a clocking sequence at a frequency corresponding to a particular clock model object, the simulator turns over control to the SIE 100 for execution of the BFMs linked to that clock model object.

Figure 10:
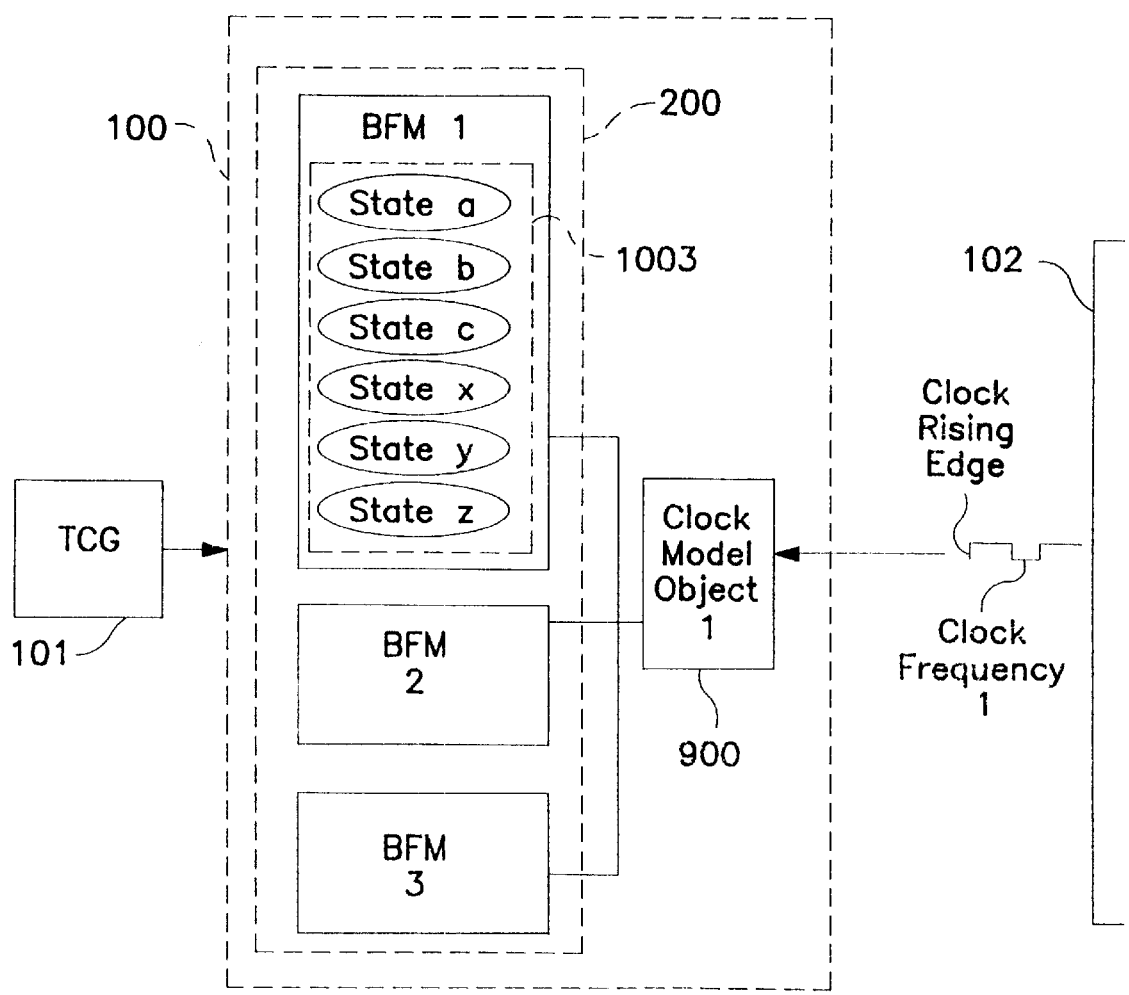
FIG. 10 shows an example of three BFMs linked to a clock model object corresponding a particular simulation clock frequency.

FIG. 10 illustrates an example of the foregoing. For simplicity, a single clock frequency 1 is illustrated, which is represented by clock model object 1, although typically each simulation cycle involves executing all the BFMs active in the session at their respective clock speeds, which are linked to a plurality of clock model objects as shown in FIG. 9.

FIG. 10 shows simulator 102 invoking clock model object 900 corresponding to clock frequency 1 of the simulator. The clock model object 900 invoked by the simulator includes functions corresponding one-to-one with the "Run Rising Edge" and "Run Falling Edge" functions in the base CTM class. In the example of FIG. 10, the clock model object is invoked by the clock rising edge. The clock model, using pointers obtained via the base CTM class 800 to all of its linked BFMs 200, serially invokes each of its linked BFMs using its "Run Rising Edge" function.

Each of the invoked BFMs 200 executes its own specialized version of a "Run Rising Edge" function, which includes invoking its current bus state function, e.g., one of bus state functions 1003. The invoked bus state function may then perform some work required of it by a stimulus from the TCG 101, which typically entails reading model facilities in the design and deciding whether to drive other model facilities or enter another state. After doing any required work, the invoked BFM returns control to the clock model so that the other linked BFMs are executed. Once all BFMs linked to all clock models invoked by the simulator have executed, control is returned by the SIE 100 to the simulator 102.

It may be appreciated from the foregoing that the simulator-independent environment according to the present invention allows a test case generator to apply test cases to a model without having to be concerned with any simulator-specific detail. Test cases can be written in a high-level language, using, for example, simple character strings to refer to corresponding design elements in a model. The simulator-independent environment allow the tests case to be run on any simulator supported by the environment.

Further, the simulator-independent clocking mechanisms described above enables a general BFM, i.e., a BFM which is not specific to an HDL or a simulator, to be configured to run at any clock speed, simply by being associated with the appropriate clock model object as described above.

Figure 11:
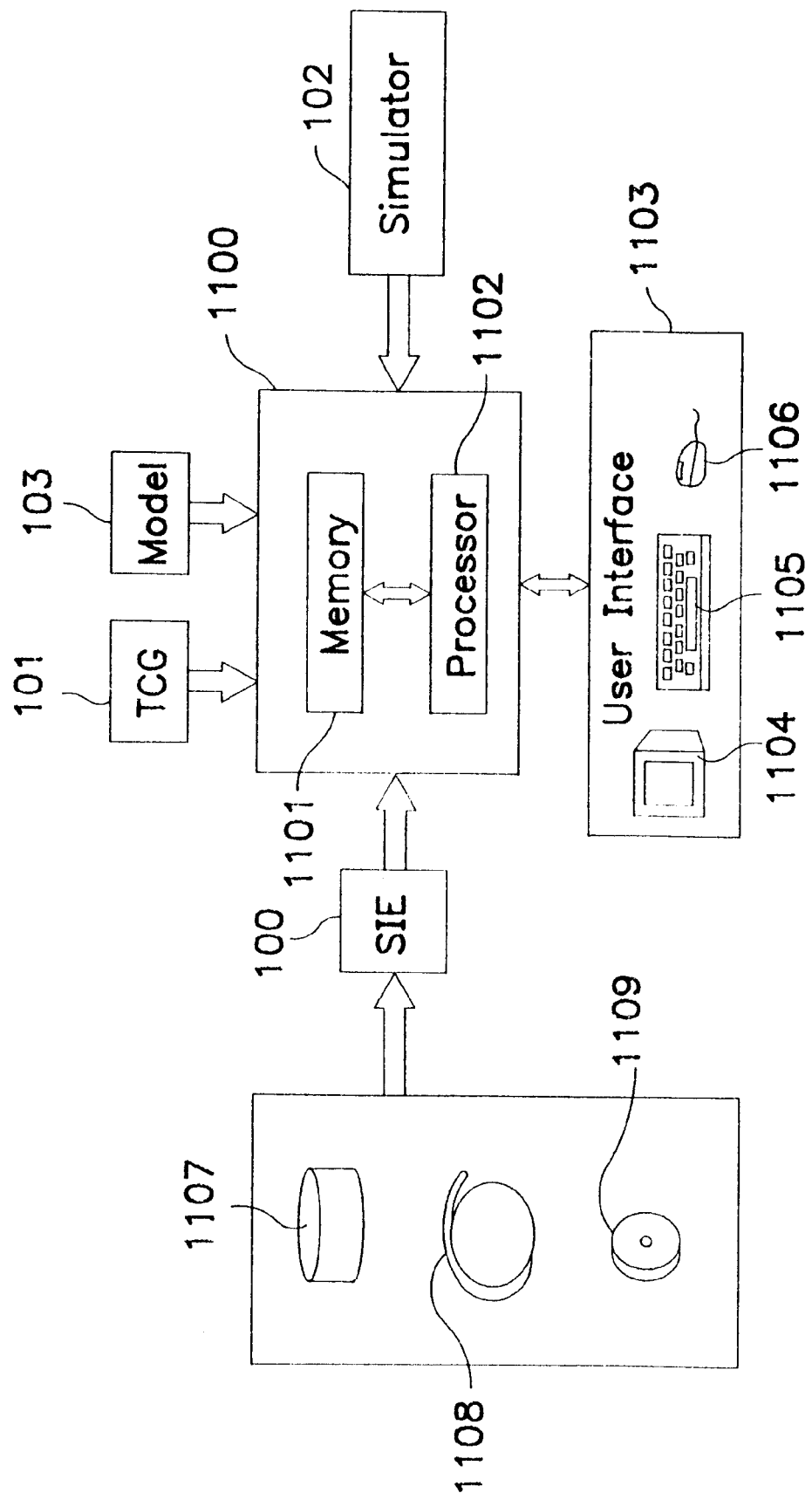
FIG. 11 shows a general purpose computer system for practicing the invention.

FIG. 11 illustrates a general purpose computer system which can be used to practice the invention. The system includes a computer 1100 comprising a memory 1101 and a processor 1102 which may be embodied, for example, in a workstation. The system further includes a user interface 1103 comprising a display device 1104 and user-input devices such as a keyboard 1105 and mouse 1106 for purposes of, for example, initiating and controlling a simulation session and observing simulation status and results.

The SIE 100, as noted above, may be implemented as computer-executable instructions which may be stored on a computer-usable medium such as disk 1107, tape 1108 or CD-ROM 1109. The instructions may be read from a computer-usable medium as noted into the memory 1101 and executed by the processor 1102 to effect the advantageous features of the invention.

The simulator 102 may be any of a variety of commercially-available simulators, including event simulators, cycle simulators and instruction set simulators. The simulator may run on the same workstation 1100 as the SIE 100. The processor 1102 would execute the simulator (simulation software) 102, which would use the input simulatable model 103 to simulate the behavior of a corresponding hardware device in response to instructions executed by the TCG 101.

The foregoing description of the invention illustrates and describes the present invention. Additionally, the disclosure shows and describes only the preferred embodiments of the invention, but it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method of performing simulator-independent verification of an integrated circuit design, comprising:

using a simulator to simulate said design from a software model representing said design;

providing a test case generator to generate a stimulus in a first form to said model, wherein said first form is a high-level programming language;

providing a simulator-independent environment interfacing between said test case generator and said simulator;

initializing one or more model facility objects with correlated simulator-specific information;

converting said stimulus from said first form into a simulator-specific form using said simulator-independent environment; and applying said stimulus in said simulator-specific form to said model being simulated.

2. The method of claim 1 wherein said step of converting comprises:

providing simulator-specific information within said simulator-independent environment;

receiving said stimulus in said first form from said test case generator; and obtaining simulator-specific information corresponding to said stimulus from said simulator-specific information.

3. The method of claim 2, wherein said step of obtaining comprises using a grouping of data and function corresponding to a distinct simulator to access said simulator-specific information.

4. The method of claim 3, wherein said grouping is a member of a hierarchy comprising a first level defining a simulator class and a second level below said first level defining a member of said simulator class representing a distinct simulator, said grouping belonging to said second level.

5. The method of claim 1, wherein said simulator-independent environment includes a bus functional model for generating signals representing a bus protocol to said model being simulated in response to said stimulus.

6. The method of claim 5, wherein said bus functional model is a member of a hierarchy comprising a base class containing function and data relating to said bus functional model.

7. The method of claim 5, further comprising:
linking said bus functional model with a clock model included in said simulator-independent environment and representing a distinct simulator clock frequency, wherein said bus functional model generates signals to said model being simulated at said clock frequency.

8. The method of claim 5, further comprising linking a plurality of said bus functional models to a plurality of said clock models representing a plurality of distinct simulator clock frequencies.

9. The method of claim 1, wherein said initializing one or more model facility objects with correlated simulator-specific information includes providing information from an alias file.

10. The method of claim 1, further comprising accessing a hardware element of the simulated design through a corresponding facility class.

11. The method of claim 1, further comprising providing multiple simulator-independent clock models to associated bus functional models between said test case generator and said simulator-independent environment, wherein at least two of the multiple clock models run at different clock frequencies.

12. A method of performing simulator-independent verification of an integrated circuit design, comprising:
using a simulator to simulate said design from a software model representing said design;
providing a test case generator to generate a stimulus in a first form to said model;
providing a simulator-independent environment interfacing between said test case generator and said simulator;
initializing one or more model facility objects with correlated simulator-specific information;
converting said stimulus from said first form into a simulator-specific form using said simulator-independent environment; and
applying said stimulus in said simulator-specific form to said model being simulated;
wherein said step of converting comprises
providing simulator-specific information within said simulator-independent environment;
receiving said stimulus in said first form from said test case generator; and
obtaining simulator-specific information corresponding to said stimulus from said simulator-specific information,
wherein said simulator-specific information correlates design elements in said model with symbols used by said simulator-independent environment.

13. The method of claim 12, wherein said simulator-specific information comprises a first level defining a design element class, and a second level below said first level comprising at least one member of said design element class representing a distinct design element.

14. A system for performing simulator-independent verification of an integrated circuit design, comprising:
simulator means for simulating said design from a software model representing said design;
test case generator means for generating a stimulus in a first form to said model,
wherein said first form is a high-level programming language;
initialization means for initializing one or more model facility objects with correlated simulator-specific information; and
simulator-independent means for interfacing between said test case generator means and said simulator means and converting said stimulus from said first form into a simulator-specific form for application to said model being simulated.

15. The system of claim 14, wherein said simulator-independent means includes a bus functional model for generating signals representing a bus protocol to said model being simulated in response to said stimulus.

16. The system of claim 15, wherein said bus functional model is a member of a hierarchy comprising a base class containing function and data relating to said bus functional model.

17. The system of claim 15, further comprising means for linking said bus functional model with a clock model included in said simulator-independent means and representing a distinct simulator clock frequency, whereby said bus functional model may generate signals to said model being simulated at said clock frequency.

18. The system of claim 15, further comprising means for linking a plurality of said bus functional models to a plurality of said clock models representing a plurality of distinct simulator clock frequencies.

19. The system of claim 14, wherein said initialization means provides information from an alias file to one of said one or more model facility objects.

20. The system of claim 14, wherein said initialization means accesses a hardware element of the simulated design through a corresponding facility class.

21. The system of claim 14, further comprising multiple simulator-independent clock models driving associated bus functional models, wherein at least two of the multiple clock models run at different clock frequencies.

22. A system for performing simulator-independent verification of an integrated circuit design, comprising:
simulator means for simulating said design from a software model representing said design;
test case generator means for generating a stimulus in a first form to said model;
initialization means for initializing one or more model facility objects with correlated simulator-specific information; and
simulator-independent means for interfacing between said test case generator means and said simulator means and convening said stimulus from said first form into a simulator-specific form for application to said model being simulated,
wherein said simulator-independent means comprises simulator-specific information correlating design elements in said model with symbols used by said simulator-independent means.

23. The system of claim 22, wherein said simulator-specific information comprises a first level defining a design element class, and a second level below said first level comprising at least one member of said design element class representing a distinct design element.

24. The system of claim 22, wherein said simulator-independent means further comprises a grouping of data and function corresponding to a distinct simulator for accessing said simulator-specific information.

25. The system of claim 24, wherein said grouping is a member of a hierarchy comprising a first level defining a simulator class and a second level below said first level defining a member of said simulator class representing a distinct simulator, said grouping belonging to said second level.

26. A computer-usable medium storing computer-executable instructions, said instructions when executed implementing a method of performing simulator-independent verification of an integrated circuit design, said method comprising:

converting a stimulus received in a first form from a test case generator into a simulator-specific form;

initializing one or more model facility objects with correlated simulator-specific information; and applying said stimulus in said simulator-specific form to a model being simulated by a simulator, wherein said first form is a high-level programming language.

27. The computer-usable medium of claim 26 wherein said step of converting comprises:

obtaining simulator-specific information corresponding to said stimulus from simulator-specific information derived during an initialization process.

28. The computer-usable medium of claim 27, wherein said step of obtaining comprises using a grouping of data and function corresponding to a distinct simulator to access said simulator-specific information.

29. The computer-usable medium of claim 28, wherein said grouping is a member of a hierarchy comprising a first level defining a simulator class and a second level below said first level defining a member of said simulator class representing a distinct simulator, said grouping belonging to said second level.

30. The computer-usable medium of claim 26, wherein said instructions implement a bus functional model for generating signals representing a bus protocol to said model being simulated in response to said stimulus.

31. The computer-usable medium of claim 30, wherein said bus functional model is a member of a hierarchy comprising a base class containing function and data relating to said bus functional model.

32. The computer-usable medium of claim 30, said method further comprising:

linking said bus functional model with a clock model implemented by said instructions and representing a distinct simulator clock frequency, wherein said bus functional model generates signals to said model being simulated at said clock frequency.

33. The computer-usable medium of claim 30, said method further comprising linking a plurality of said bus functional models to a plurality of said clock models representing a plurality of distinct simulator clock frequencies.

34. The computer-usable medium of claim 26, wherein, in said method, said initializing one or more model facility objects with correlated simulator-specific information includes providing information from an alias file.

35. The computer-usable medium of claim 26, wherein said method further comprises accessing a hardware element of the simulated design through a corresponding facility class.

36. The computer-usable medium of claim 26, wherein said method further comprises providing multiple simulator-independent clock models to associated bus functional models between said test case generator and a simulator-independent environment, wherein at least two of the multiple clock models run at different clock frequencies.

37. A computer-usable medium storing computer-executable instructions, said instructions when executed implementing a method of performing simulator-independent verification of an integrated circuit design, said method comprising:

converting a stimulus received in a first form from a test case generator into a simulator-specific form;

initializing one or more model facility objects with correlated simulator-specific information; and applying said stimulus in said simulator-specific form to a model being simulated by a simulator, wherein said step of converting comprises obtaining simulator-specific information corresponding to said stimulus from simulator-specific information derived during an initialization process, and wherein said simulator-specific information correlates design elements in said model with symbols used by said instructions.

38. The computer-usable medium of claim 37, wherein said simulator-specific information comprises a first level defining a design element class, and a second level below said first level comprising at least one member of said design element class representing a distinct design element.

* * * * *